US006717139B2

(12) United States Patent
Taniguchi

(10) Patent No.: US 6,717,139 B2
(45) Date of Patent: Apr. 6, 2004

(54) ION LENS FOR A MASS SPECTROMETER

(75) Inventor: Junichi Taniguchi, Kyoto (JP)

(73) Assignee: Shimadzu Corporation, Kyoto (JP)

(*) Notice: Subject to any disclaimer, the term of this patent is extended or adjusted under 35 U.S.C. 154(b) by 0 days.

(21) Appl. No.: 10/442,223

(22) Filed: May 21, 2003

(65) Prior Publication Data

US 2003/0222213 A1 Dec. 4, 2003

(30) Foreign Application Priority Data

Jun. 4, 2002 (JP) ....................................... 2002-162842

(51) Int. Cl.[7] ................................................ H01J 37/00
(52) U.S. Cl. .................................... 250/292; 250/396 R
(58) Field of Search ................................ 250/292, 293, 250/396 R

(56) References Cited

U.S. PATENT DOCUMENTS 6,576,898 B2 * 6/2003 Waki .......................... 250/292

FOREIGN PATENT DOCUMENTS

JP 2000-149865 5/2000

* cited by examiner

*Primary Examiner*—Kiet T. Nguyen
(74) *Attorney, Agent, or Firm*—Westerman, Hattori, Daniels & Adrian, LLP

(57) ABSTRACT

A mass spectrometer according to the present invention includes: an ion source; a mass analyzer for analyzing ions generated by the ion source with their mass to charge ratio; an ion lens composed of platelet electrodes of an even number no less than four arranged radially and symmetrically around an ion optical axis connecting the ion source and the mass analyzer; and a voltage generator for applying a voltage composed of a DC voltage and an RF voltage to a group of alternately arranged platelet electrodes and for applying another voltage composed of the same DC voltage and another RF voltage having the same frequency and the opposite polarity to the other group of alternately arranged platelet electrodes. When ions are introduced into the ion traveling space defined by the inner surfaces of the platelet electrodes, the ions travel along the ion optical axis and converge to a rear focal point of the ion lens, while they are vibrated by the voltages applied to the platelet electrodes. By placing a small hole or orifice communicating to the next chamber at the rear focal point of the ion lens, larger number of ions can be sent to the next chamber, which enhances the sensitivity and precision of the mass spectrometer.

19 Claims, 6 Drawing Sheets

ION LENS FOR A MASS SPECTROMETER

The present invention relates to a mass spectrometer, especially to the ion optical system for transporting ions generated in an ion source to a mass analyzer such as a quadrupole mass filter.

Among various mass spectrometers, the Electrospray Ionization Mass Spectrometer (ESI-MS), the Atmospheric Pressure Chemical Ionizing Mass Spectrometer (ACPI-MS) and Radio-frequency Induction Plasma Mass Spectrometer (ICP-MS) are called atmospheric pressure type mass spectrometers (API-MS) because the sample is ionized under almost atmospheric pressure.

FIG. 9 is a schematic sectional view of a conventional ESI-MS, which includes the ionizing chamber 1 and the analyzing chamber 9. In the ionizing chamber 1, a nozzle 2 is provided which is connected to the exit of, for example, a liquid chromatographic column. In the analyzing chamber 9, a quadrupole filter 10 and an ion detector 11 are provided. Between the ionizing chamber 1 and the analyzing chamber 9, the first vacuum chamber 4 and the second vacuum chamber 7 are placed, where air-tight walls separate those chambers 1, 4, 7, 9. The ionizing chamber 1 and the first vacuum chamber 4 communicate with each other only with a desolvation tube 3 provided in the wall between them, where the desolvation tube 3 has a narrow conduit at its center. The first vacuum chamber 4 and the second vacuum chamber 7 communicate with each other only with a skimmer 6 provided in the wall between them, where the skimmer 6 has a very narrow orifice.

The pressure in the ionizing chamber 1, which is the ion source, is almost atmospheric due to the vaporized molecules of the liquid sample continuously supplied from the nozzle 2. The pressure of the first vacuum chamber 4 is lowered by a rotary pump to about $10^2$ Pa, that of the second vacuum chamber 7 is lowered by a turbo molecular pump to about $10^{-1}$ to $10^{-2}$ Pa, and that of the analyzing chamber 9 is made as low as $10^{-3}$ to $10^{-4}$ Pa by a turbo molecular pump. Thus the pressures of those chambers are gradually decreased from the almost atmospheric pressure of the ionizing chamber 1 to the very high vacuum of the analyzing chamber 9. This multi-stage differentiated evacuation system assures the high vacuum of the analyzing chamber 9.

The liquid sample is sprayed from the tip of the nozzle 2 into the ionizing chamber 1, wherein the sample is electrically charged (electrosprayed). When the solvent in the sprayed droplets evaporates, the sample molecules are ionized. The droplets containing such ions are drawn into the desolvation tube 3 due to the pressure difference between the ionizing chamber 1 and the first vacuum chamber 4. Since the desolvation tube 3 is heated, the solvent in the droplets further evaporates and the sample molecules are further ionized. A first ion lens 5, which may be constructed by a cylindrical electrode, is provided in the first vacuum chamber 4. The first ion lens 5, with the electric field created in it, assists the drawing-in of the ions coming through the desolvation tube 3, and converges the ions to the orifice of the skimmer 6.

The ions introduced into the second vacuum chamber 7 through the orifice of the skimmer 6 are converged and accelerated by the second ion lens 8, which may be constructed by concentrically arrayed ring electrodes, and sent to the analyzing chamber 9. In the analyzing chamber 9, only such ions that have a certain mass to charge ratio can pass through the central space of the quadrupole mass filter 10, and other ions dissipate while traveling through the space. The ions that have passed through the quadrupole mass filter 10 enter the ion detector 11, which outputs an electrical signal corresponding to the number of ions detected.

In the above construction, the first ion lens 5 and the second ion lens 8 are generally called ion optical systems, whose primary functions are to converge flying ions with their electric fields, and, in some cases, accelerate them toward the next stage. Conventionally, various types of ion optical systems have been used or proposed.

FIG. 10 shows a multi-rod type ion lens 20, which has four rods. The number of rods can be six or eight, for example, and generally it can be any even number no less than four. To any neighboring two rods among the rods of an even number, the same DC voltage plus the same RF (radio-frequency) voltages having opposite polarities are applied. Ions introduced along the central axis ("ion optical axis") C of the space surrounded by the rods travel through the space vibrating at the frequency the same as that of the RF voltage. This structure has a better ion converging efficiency, so that larger number of ions can be passed onto the next stage.

In the multi-rod type ion lens 20, however, the inscribing circle P1 (which contacts the inner surfaces) of the rods 201–204 at the entrance and the inscribing circle P2 at the exit have the same diameter, and thus the ion traveling space surrounded by the rods 201–204 is shaped almost cylindrical. As shown in FIG. 9, especially in the first vacuum chamber 4, ions ejected from the desolvation tube 3 spread conically, so that the capturing efficiency of the first ion lens 5 having a rather small entrance is rather low. If the entrance of the multi-rod type ion lens 20 is broadened, however, the converging efficiency of ions toward the orifice becomes low, on the other hand, so that the overall ion passing efficiency cannot be improved. Since, further, the value of the DC voltage is constant on the ion optical axis C, ions are not accelerated in the space. Thus, in the first vacuum chamber 4 where the pressure is rather high, compared to the low pressure or high vacuum in the following chambers, ions are deprived of their kinetic energy due to collisions with the remaining gas molecules, and fewer ions can pass through the firs ion lens 5.

Addressing the problem, the present applicant proposed a new ion lens in the Publication No. 2000-149865 of unexamined Japanese patent application. FIG. 11 shows an example of the new ion lens 21, where virtual rod electrodes 211–214 are used. A virtual rod electrode is composed of a plurality of metal plate electrodes aligned in a row along the ion optical axis C, where every metal plate is positioned substantially vertical to the ion optical axis C. Owing to such a construction of the virtual rod electrodes 211–214, the plate electrodes can be arranged as shown in FIG. 11, where they are arranged closer to the ion optical axis C toward the exit of the virtual rod electrodes. Since, in this case, the ion passing space is conical with a broader entrance, more ions can be collected at the entrance and are gradually converged to the narrower exit by the electric field produced by the virtual rod electrodes. Thus the transporting or passing efficiency of ions is improved.

Further, since different voltages can be applied to the respectively independent plate electrodes constituting a virtual rod, a static electric field having a gradient can be produced, and the ions can be accelerated.

Though the virtual rod electrodes as described above have such advantages, it is necessary to set and arrange respective plate electrodes to the proper positions, and the holding or fixing structure is rather complicated and rather cost-inefficient.

SUMMARY OF THE INVENTION

The present invention addresses the problem. An object of the present invention is therefore to provide an ion optical system having a simpler structure and high ion passing efficiency.

According to the present invention, an ion optical system for converging ions includes:

an ion lens composed of platelet electrodes of an even number no less than four arranged radially and symmetrically around an ion optical axis connecting the ion source and the mass analyzer; and a voltage generator for applying a voltage composed of a DC voltage and an RF voltage to a group of alternately arranged platelet electrodes and for applying another voltage composed of the same DC voltage and another RF voltage having the same frequency and an opposite polarity to the other group of alternately arranged platelet electrodes.

Therefore, a mass spectrometer according to the present invention includes:

an ion source;

a mass analyzer for analyzing ions generated by the ion source with their mass to charge ratio;

an ion lens composed of platelet electrodes of an even number no less than four arranged radially and symmetrically around an ion optical axis connecting the ion source and the mass analyzer; and a voltage generator for applying a voltage composed of a DC voltage and an RF voltage to a group of alternately arranged platelet electrodes and for applying another voltage composed of the same DC voltage and another RF voltage having the same frequency and an opposite polarity to the other group of alternately arranged platelet electrodes.

In the mass spectrometer of the present invention, when ions are introduced into the ion traveling space defined by the inner surfaces of the platelet electrodes, the ions travel along the ion optical axis and converge to a rear focal point of the ion lens, while they are vibrated by the above-described voltages applied to the platelet electrodes. By placing a small hole or orifice communicating to the next chamber at the rear focal point of the ion lens, larger number of ions can be sent to the next chamber, which improves the sensitivity and precision of the mass spectrometer.

A platelet electrode of the ion lens of the present invention corresponds to a rod of the conventional multi-rod type ion lens. In the present invention, the outer edge of the platelet electrode can be any shape convenient for fixing. For example, the outer edge can be a flat face, which is convenient for screw fixing. This simplifies the structure of the ion lens, and decreases the cost while maintaining the high ion passing efficiency.

A preferable variation of the ion lens of the present invention is to cut off a front corner of every platelet electrode. This makes the inscribing circle of the platelet electrodes at the entrance of the ion lens larger than that at the exit, which means that ions enter into a large entrance, and converge as they travel along the ion optical axis to the small exit. This enhances the ion passing efficiency onto a small hole or orifice communicating to the next chamber.

The cutting line of the corner cut-off is not limited to a straight line, but it can be curved as long as the inscribing circle becomes monotonously smaller as the ions progress.

Another variation of the ion lens of the present invention is to use an electrically insulating material for the platelet electrodes, and to form an electrically resistive layer on the inner surface of every platelet electrode. Then a pair of conductive layers are formed on the front edge and on the rear edge of every platelet electrode, wherein a pair of voltages composed of the same RF voltage and different DC voltages are applied to the front edge conductive layer and the rear edge conductive layer respectively.

Still another variation of the ion lens of the present invention is to use a semiconducting material for the platelet electrodes. In this case, no electrically resistive layer is necessary on the inner surface of every platelet electrode. A pair of conductive layers are also formed on the front edge and on the rear edge of every platelet electrode, wherein a pair of voltages composed of the same RF voltage and different DC voltages are applied to the front edge conductive layer and the rear edge conductive layer respectively.

In those ion lenses, due to the difference in the DC voltages applied to the front and rear edges, a voltage gradient is produced in the inner surface of every platelet electrode along the ion optical axis. The voltage gradient of the platelet electrodes surrounding the ion traveling space produces a potential gradient in it, which gives ions kinetic energy and accelerates them. This decreases the possibility of dissipation of ions due to loss of kinetic energy, and enhances the ion passing efficiency.

The ion lens of the present invention is suitable especially for such a type of mass spectrometer that ions spread broadly in the entrance or ions tend to lose kinetic energy due to collisions with remaining gas molecules in a rather low vacuum. Thus the ion lens of the present invention is suited to be used in a mass spectrometer in which:

the ion source is placed in a chamber of almost atmospheric pressure;

the mass analyzer is placed in a chamber with a high vacuum;

a plurality of intermediate vacuum chambers are placed between the ion source chamber and the mass analyzer chamber; and the ion lens is placed in a chamber adjacent to the ion source chamber.

BRIEF DESCRIPTION OF THE ATTACHED DRAWINGS

DETAIL DESCRIPTION OF PREFERRED EMBODIMENTS

Figure 1:
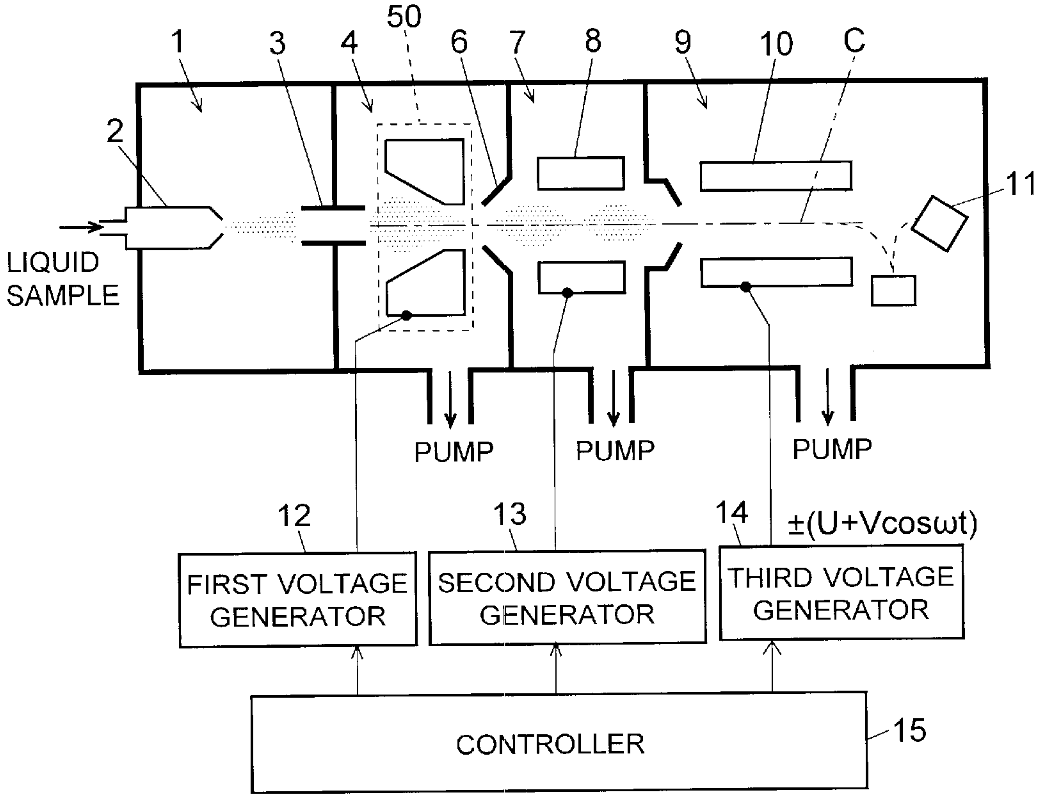
FIG. 1 is a schematic sectional view of an electrospray ionization mass spectrometer (ESI-MS) embodying the present invention.
Figure 9:
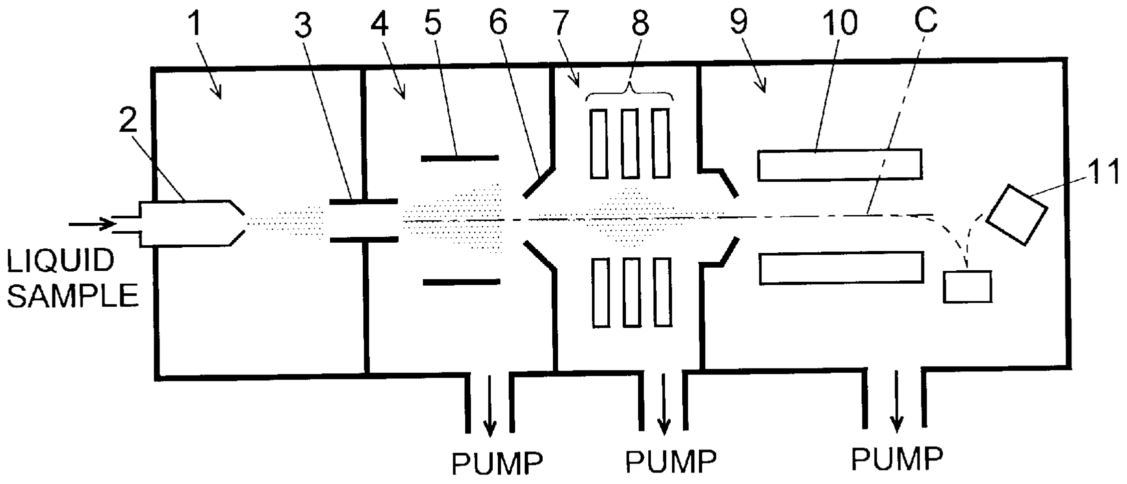
Fig. 9 PRIOR ART
FIG. 9 is a schematic sectional view of a conventional ESI-MS.
Figure 10:
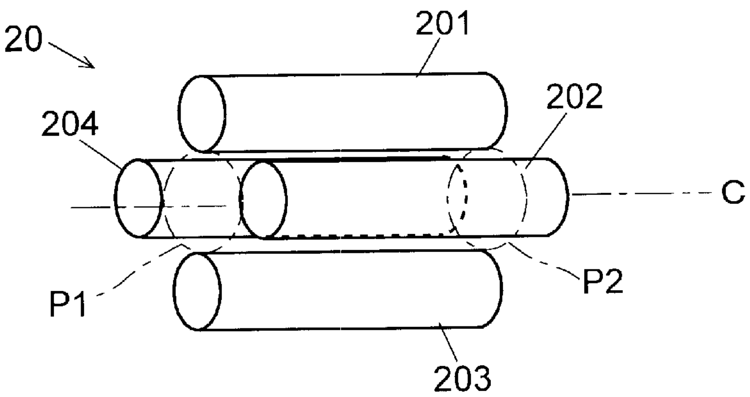
Fig. 10 PRIOR ART
FIG. 10 is a perspective view of a multi-rod type ion lens.
Figure 11:
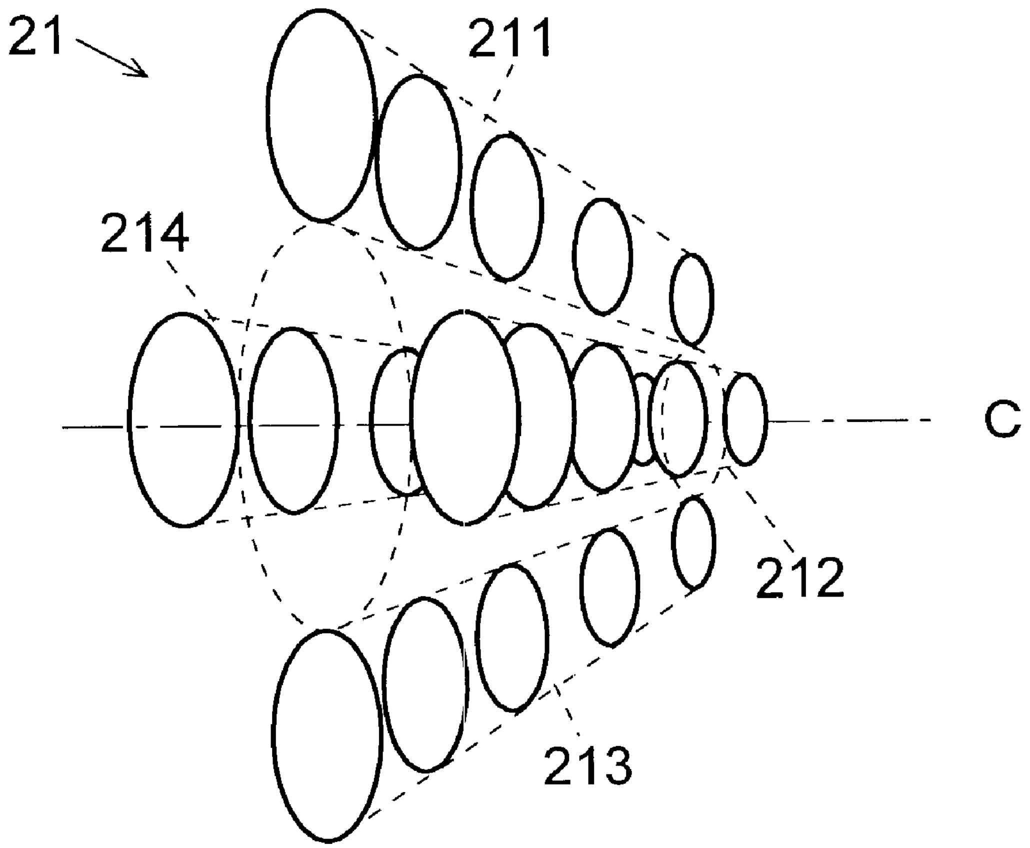
Fig. 11 PRIOR ART
FIG. 11 is a perspective view of a virtual rod type ion lens.

An electrospray ionization mass spectrometer (ESI-MS) embodying the present invention is described with reference to the attached drawings. FIG. 1 is a schematic sectional view of the ESI-MS, where the same or similar parts as those of FIG. 9 are assigned the same reference numbers and the description made above can be applied the same or similarly here.

As shown in FIG. 1, the first ion lens 50, which is characteristic to the present embodiment, is provided inside the first vacuum chamber 4. The first, second and third voltage generators 12, 13, 14 generate voltages for applying to the first ion lens 50, the second ion lens 8 and the quadrupole filter 10, wherein the values of the voltages are controlled by the controller 15. The nozzle 2, the desolvation tube 3 and the skimmer 6 are also applied respectively proper voltages (normally DC voltages). In the present embodiment, the second ion lens 8 provided in the second vacuum chamber 7 adopts the multi-rod type, which is different from that in FIG. 9. But the type of the second ion lens 8 is not important in the present invention, and any other type can be used.

Figure 2:
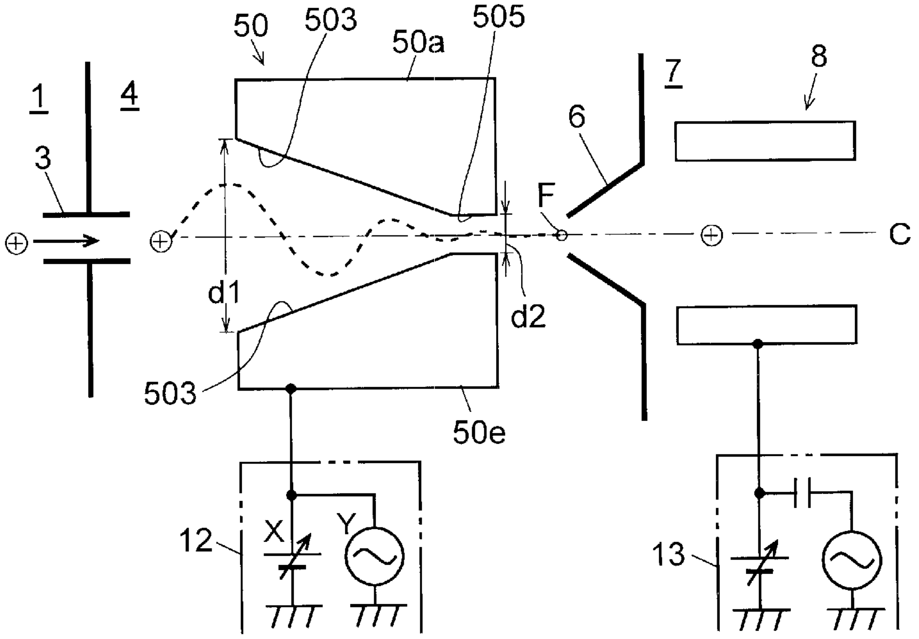
FIG. 2 is a detailed sectional view of the first vacuum chamber of the embodiment.
Figure 3A:
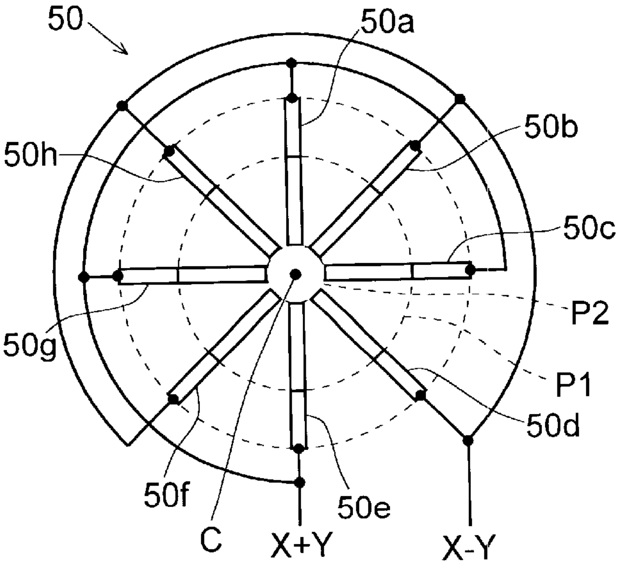
FIG. 3A is a front view of the first ion lens.
Figure 3B:
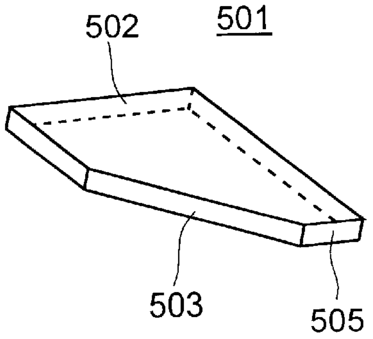
FIG. 3B is a perspective view of a platelet electrode.

The first ion lens 50 is composed of eight pieces of platelet electrode 501. As shown in FIG. 3A, the eight platelet electrodes 50*a*–50*h* are placed radially and symmetrically around the ion optical axis C with a 45° angle gap between neighboring platelets. As shown in FIG. 3B, a platelet electrode 501 is made of a substantially rectangular metal (or other conductive material) plate 502 with a corner cut-off 503. As shown in FIG. 2, the corner cut-off 503 of every platelet electrode 50*a*–50*h* is directed to the ion entrance and the ion optical axis C. The cutting line of the corner cut-off 503 is not limited to a straight line as shown in FIG. 3B, but it can be curved as long as the inscribing circle becomes monotonously smaller as the ions progress.

In the first ion lens 50, the space defined by the inner surfaces (where an inner surface is composed of a corner cut-off 503 and an inner edge 505) of the platelet electrodes 50*a*–50*h* is the ion passing space. The inscribing circle P1 at the entrance of the space has the diameter d1, and the inscribing circle P2 at the exit has the diameter d2 which is very small compared to d1, whereby the space is shaped frustum with a short cylinder at the smaller end.

As shown in FIG. 3B, alternately positioned platelet electrodes form a group and are electrically connected to each other: that is, the platelet electrodes 50*a*, 50*c*, 50*e* and 50*g* form a first group and the other platelet electrodes 50*b*, 50*d*, 50*f* and 50*h* form a second group. The platelet electrodes 50*a*, 50*c*, 50*e* and 50*g* of the first group are applied with a DC voltage X plus an RF voltage Y, while the platelet electrodes 50*b*, 50*d*, 50*f* and 50*h* of the second group are applied with the same DC voltage X minus the RF voltage Y (or the DC voltage plus an RF voltage of the same frequency and the opposite polarity). Owing to the voltages applied to the platelet electrodes 50*a*–50*h* positioned around the ion optical axis C, an RF electric field is produced in the ion traveling space.

Ions sucked from the ionizing chamber 1 into the desolvation tube 3 due to the pressure difference between the ionizing chamber 1 and the first vacuum chamber spread conically into the first vacuum chamber 4. In the ESI-MS of the present embodiment, the entrance of the ion traveling space is large, so that more ions can enter the ion traveling space surrounded by the platelet electrodes 50*a*–50*h*. While the ions travel through the space along the ion optical axis C, they vibrate due to the RF electrical field produced in the space, but the amplitude of the vibration gradually decreases as they travel to the exit. When they exit the ion traveling space, they are converged into a flow with a small diameter, and are passed onto the second vacuum chamber 7 through the orifice of the skimmer 6 with high efficiency.

The vibrating frequency of the ions traveling through the space in the first ion lens 50 depends on the voltage applied to the first ion lens 50 and the mass to charge ratio of the ions. It is therefore possible to converge only such ions that have a certain mass to charge ratio to the rear focal point F of the first ion lens 50 by adjusting the voltages X and/or Y appropriately. This enables a selection of ions by the first ion lens 50 where only ions having the certain mass to charge ratio are passed onto the second vacuum chamber through the orifice, but other ions are deliberately dissipated and drawn out of the chamber by the vacuum pump.

Since the outer edge of every platelet electrode 50*a*–50*h* is straight and parallel to the ion optical axis C, and the side faces of every platelet electrode 50*a*–50*h* are both flat, the platelet electrodes 50*a*–50*h* can be held by a simple holder. There is no need to use welding or other troublesome fixing means, but the simple screw fixing, or some other simple fixing means normally used, can be used. The holder may be made of a conductive ring, whereby the ring functions as a holder and an electrical conduction path to the platelet electrodes 50*a*–50*h*.

In the above embodiment, the oblique edges of the corner cut-off form the conical ion traveling space. As shown in FIG. 3A, the inscribing circle P1 at the entrance has a larger diameter than that P2 at the exit, so that the distance between neighboring platelet electrodes 501 is larger at the entrance than at the exit. This causes a weaker electric field at the entrance than at the exit.

Figure 4A:
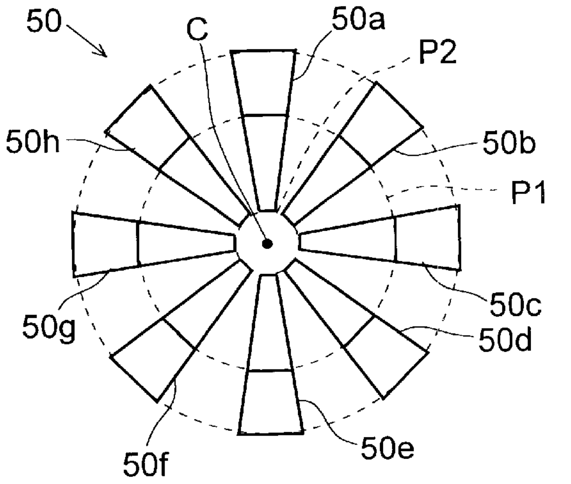
FIG. 4A is a front view of the first ion lens of another embodiment.
Figure 4B:
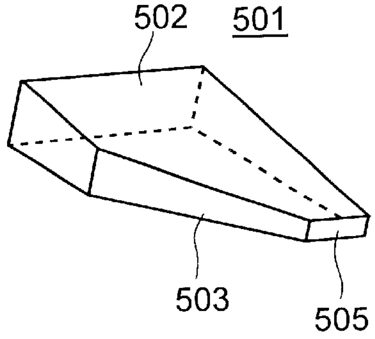
FIG. 4B is a perspective view of its platelet electrode.
Figure 5A:
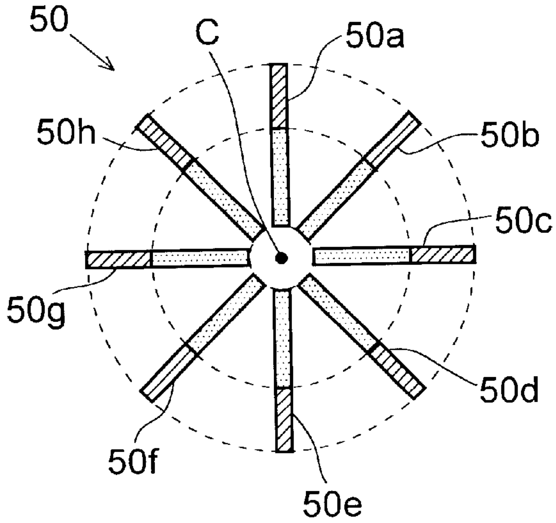
FIG. 5A is a front view of the first ion lens of still another embodiment.
Figure 5B:
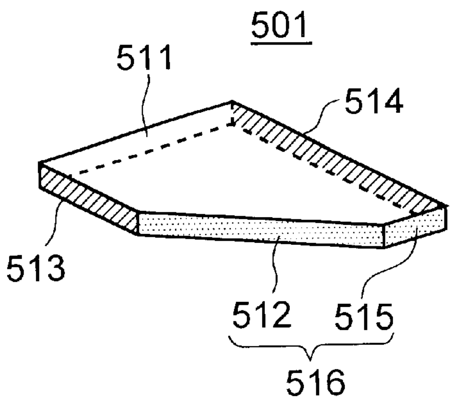
FIG. 5B is a perspective view of its platelet electrode.

In order to strengthen the weak electric field at the entrance, the platelet electrodes may be formed as shown in FIGS. 4A and 4B. These figures correspond to FIGS. 3A and 3B, but the electric connections are omitted in FIG. 4A. In the example of the first ion lens shown in FIGS. 4A and 4B, a platelet electrode 501 is wedge-shaped where the thickness is larger at a farther position from the ion optical axis C. This structure lessens the difference between the entrance and exit in the distance between neighboring platelet electrodes compared to the structure of FIGS. 3A and 3B. The electric field at the entrance can be strong enough owing to the structure, and ions can be adequately converged.

Since, in the above embodiment, the DC or static electric field is almost constant along the ion optical axis C, the DC electric field does not accelerate ions (exactly saying, it is not constant because the distance between the ion optical axis C and the innermost edge of every platelet electrode is not constant, but it makes no significant difference). Since many remaining gas molecules enter the first vacuum chamber 4 through the desolvation tube 3, ions collide with such remaining gas molecules and lose kinetic energy. Such ions deviate from the ion optical axis C and cannot enter the orifice. If ions are accelerated and given kinetic energy toward the exit, they do not deviate from the course even if they collide with remaining gas molecules, and so more ions can enter the orifice.

Another type of ESI-MS shown in FIGS. 5A–8B also embodying the present invention realizes the above mentioned. As shown in FIG. 5B the shape of the platelet electrode 511 of the present embodiment is the same as that shown in FIG. 3B, but that of the present embodiment is made of insulating material such as ceramic or plastic. An electrically resistive layer 516 is formed on the inner surface, which is constituted by the corner cut-off surface 512 and the inner edge surface 515, of the platelet electrode 511. And conductive layers 513 and 514 are formed on the surfaces of the front edge and the rear edge of the platelet electrode 511, which flank the electrically resistive layer 516. The conductive layers 513 and 514 function as the lead to the electrically resistive layer 516.

Figure 6:
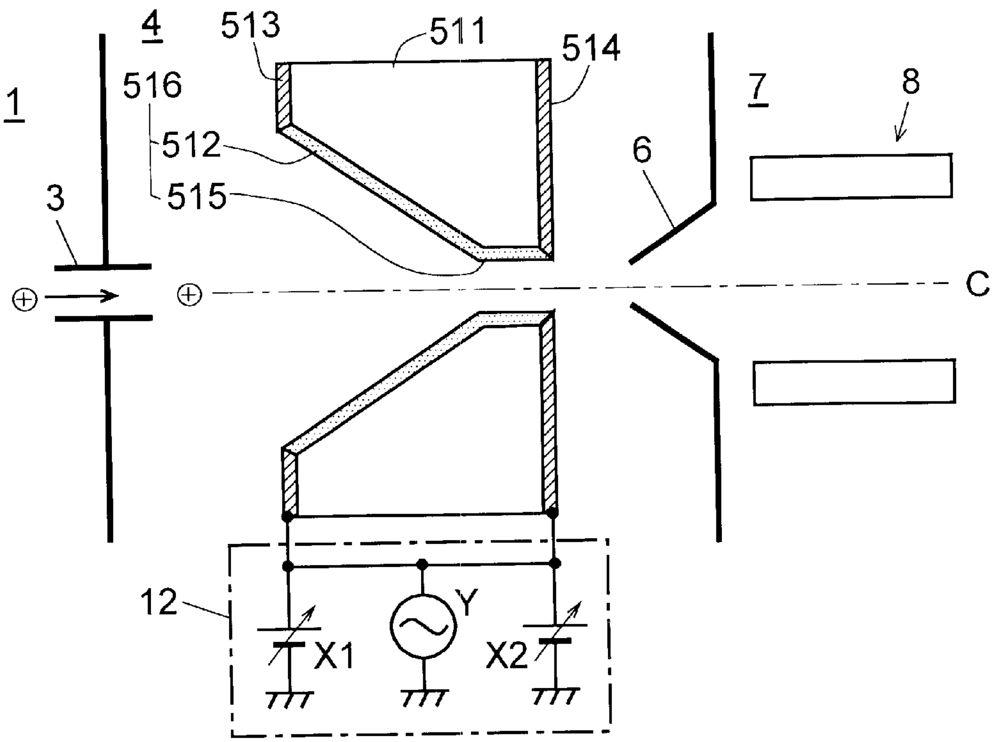
FIG. 6 is a detailed sectional view of the first vacuum chamber of another embodiment.
Figure 7:
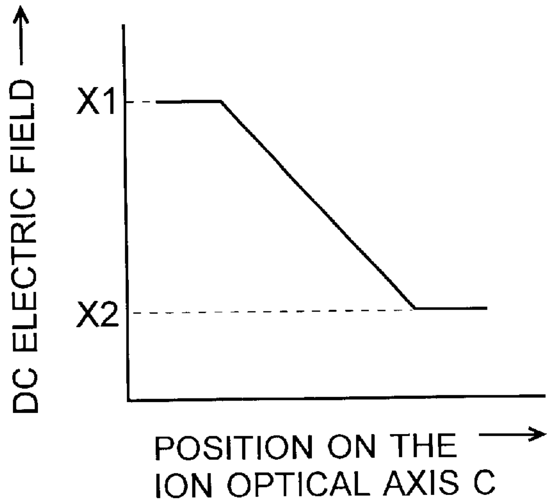
FIG. 7 is a graph showing the potential gradient on the ion optical axis.

As shown in FIG. 6, voltages consisting of the same RF voltage and different DC voltages X1+Y and X2+Y are applied to the front edge conductive layer 513 and the rear edge conductive layer 514 respectively. Due to the same RF voltage but different DC voltages X1+Y and X2+Y applied to both ends, a voltage gradient develops in the electrically resistive layer 516 in the direction of ion traveling. The electric potential on the ion optical axis C is shown in FIG. 7. Thus ions introduced in the ion traveling space not only vibrate by the RF electric field produced by the RF voltage, but also are given kinetic energy and accelerated by the potential gradient produced by the voltage gradient. This enables ions that have inadequate kinetic energy when entering the first ion lens 50 being accelerated due to the potential gradient and being sent to the orifice of the skimmer with high efficiency.

Figure 8A:
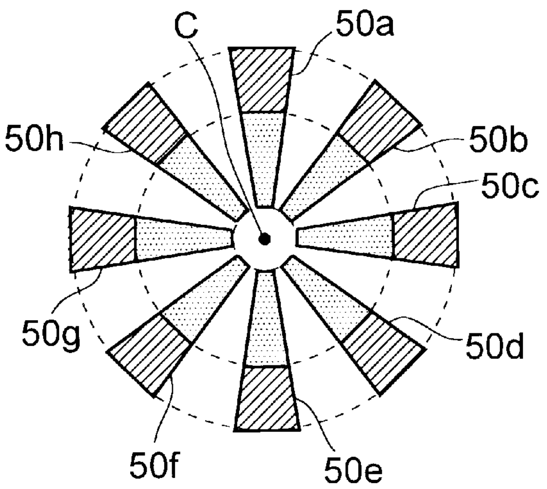
FIG. 8A is a front view of the first ion lens of still another embodiment.
Figure 8B:
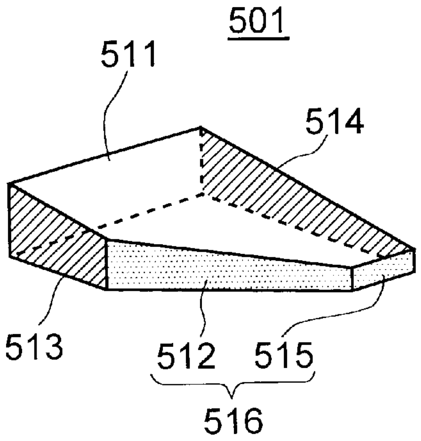
FIG. 8B is a perspective view of its platelet electrode.

It is easily expected by those skilled in the art to combine the above construction of potential gradient in the first ion lens 50 with the wedge shaped platelet electrode of FIG. 4, as shown in FIGS. 8A and 8B. Further it is possible to make the platelet electrodes 511 with material having semiconductive characteristic, whereby voltages as described above are applied to the front and rear edges to develop the voltage gradient in the inner surface constituted by the corner cut-off surface and the inner edge surface.

What is claimed is:

1. An ion optical system for converging ions comprising:

an ion lens composed of platelet electrodes of an even number no less than four arranged radially and symmetrically around an ion optical axis; and a voltage generator for applying a voltage composed of a DC voltage and an RF voltage to a group of alternately arranged platelet electrodes and for applying another voltage composed of the same DC voltage and another RF voltage having the same frequency and an opposite polarity to the other group of alternately arranged platelet electrodes.

2. The ion optical system according to claim 1, wherein a front corner of every platelet electrode is cut off, whereby an inscribing circle at a front end of the ion lens is larger than that at a rear end.

3. The ion optical system according to claim 2, wherein a thickness of every platelet electrode is larger at a farther position from the ion optical axis C.

4. The ion optical system according to claim 3, wherein:

the platelet electrode is made of an electrically insulating material;

an electrically resistive layer is formed on an inner surface of every platelet electrode;

a pair of conductive layers are formed on a front edge and on a rear edge of every platelet electrode; and a pair of voltages composed of the same RF voltage and different DC voltages are applied to the front edge conductive layer and the rear edge conductive layer respectively.

5. The ion optical system according to claim 3, wherein:

the platelet electrode is made of a semiconductive material;

a pair of conductive layers are formed on a front edge and on a rear edge of every platelet electrode; and a pair of voltages composed of the same RF voltage and different DC voltages are applied to the front edge conductive layer and the rear edge conductive layer respectively.

6. The ion optical system according to claim 2, wherein:

the platelet electrode is made of an electrically insulating material;

an electrically resistive layer is formed on an inner surface of every platelet electrode;

a pair of conductive layers are formed on a front edge and on a rear edge of every platelet electrode; and a pair of voltages composed of the same RF voltage and different DC voltages are applied to the front edge conductive layer and the rear edge conductive layer respectively.

7. The ion optical system according to claim 2, wherein:

the platelet electrode is made of a semiconductive material;

a pair of conductive layers are formed on a front edge and on a rear edge of every platelet electrode; and a pair of voltages composed of the same RF voltage and different DC voltages are applied to the front edge conductive layer and the rear edge conductive layer respectively.

8. The ion optical system according to claim 1, wherein:

the platelet electrode is made of an electrically insulating material;

an electrically resistive layer is formed on an inner surface of every platelet electrode;

a pair of conductive layers are formed on a front edge and on a rear edge of every platelet electrode; and a pair of voltages composed of the same RF voltage and different DC voltages are applied to the front edge conductive layer and the rear edge conductive layer respectively.

9. The ion optical system according to claim 1, wherein:

the platelet electrode is made of a semiconductive material;

a pair of conductive layers are formed on a front edge and on a rear edge of every platelet electrode; and a pair of voltages composed of the same RF voltage and different DC voltages are applied to the front edge conductive layer and the rear edge conductive layer respectively.

10. A mass spectrometer comprising:

an ion source;

a mass analyzer for analyzing ions generated by the ion source with their mass to charge ratio;

an ion lens composed of platelet electrodes of an even number no less than four arranged radially and symmetrically around an ion optical axis connecting the ion source and the mass analyzer; and a voltage generator for applying a voltage composed of a DC voltage and an RF voltage to a group of alternately arranged platelet electrodes and for applying another voltage composed of the same DC voltage and another RF voltage having the same frequency and an opposite polarity to the other group of alternately arranged platelet electrodes.

11. The mass spectrometer according to claim 10, wherein a front corner of every platelet electrode is cut off, whereby an inscribing circle at a front end of the ion lens is larger than that at a rear end.

12. The mass spectrometer according to claim 11, wherein a thickness of every platelet electrode is larger at a farther position from the ion optical axis C.

13. The mass spectrometer according to claim 12, wherein:

the platelet electrode is made of an electrically insulating material;

an electrically resistive layer is formed on an inner surface of every platelet electrode;

a pair of conductive layers are formed on a front edge and on a rear edge of every platelet electrode; and a pair of voltages composed of the same RF voltage and different DC voltages are applied to the front edge conductive layer and the rear edge conductive layer respectively.

14. The mass spectrometer according to claim 12, wherein:

the platelet electrode is made of a semiconductive material;

a pair of conductive layers are formed on a front edge and on a rear edge of every platelet electrode; and a pair of voltages composed of the same RF voltage and different DC voltages are applied to the front edge conductive layer and the rear edge conductive layer respectively.

15. The mass spectrometer according to claim 11, wherein:

the platelet electrode is made of an electrically insulating material;

an electrically resistive layer is formed on an inner surface of every platelet electrode;

a pair of conductive layers are formed on a front edge and on a rear edge of every platelet electrode; and a pair of voltages composed of the same RF voltage and different DC voltages are applied to the front edge conductive layer and the rear edge conductive layer respectively.

16. The mass spectrometer according to claim 11, wherein:

the platelet electrode is made of a semiconductive material;

a pair of conductive layers are formed on a front edge and on a rear edge of every platelet electrode; and a pair of voltages composed of the same RF voltage and different DC voltages are applied to the front edge conductive layer and the rear edge conductive layer respectively.

17. The mass spectrometer according to claim 10, wherein:

the platelet electrode is made of an electrically insulating material;

an electrically resistive layer is formed on an inner surface of every platelet electrode;

a pair of conductive layers are formed on a front edge and on a rear edge of every platelet electrode; and a pair of voltages composed of the same RF voltage and different DC voltages are applied to the front edge conductive layer and the rear edge conductive layer respectively.

18. The mass spectrometer according to claim 10, wherein:

the platelet electrode is made of a semiconductive material;

a pair of conductive layers are formed on a front edge and on a rear edge of every platelet electrode; and a pair of voltages composed of the same RF voltage and different DC voltages are applied to the front edge conductive layer and the rear edge conductive layer respectively.

19. The mass spectrometer according to claim 10, wherein:

the ion source is placed in a chamber of almost atmospheric pressure;

the mass analyzer is placed in a chamber with a high vacuum;

a plurality of intermediate vacuum chambers are placed between the ion source chamber and the mass analyzer chamber; and the ion lens is placed in a chamber adjacent to the ion source chamber.

* * * * *